United States Patent [19]

Ballaro' et al.

[11] Patent Number: 5,083,182
[45] Date of Patent: Jan. 21, 1992

[54] DARLINGTON DEVICE WITH AN ULTRA-LIGHTWEIGHT EMITTER SPEED-UP TRANSISTOR

[75] Inventors: David Ballaro'; Alfonso Patti; Giuseppe Ferla; Ferruccio Frisina, all of Catania, Italy

[73] Assignee: SGS-Thomson Microelectronics SRL, Brinza, Italy

[21] Appl. No.: 425,981

[22] Filed: Oct. 24, 1989

[30] Foreign Application Priority Data

Oct. 28, 1988 [IT] Italy .................. 6621 A/88

[51] Int. Cl.$^5$ .................. H01L 27/02
[52] U.S. Cl. .................. 357/46; 357/44; 357/86; 357/15
[58] Field of Search .................. 357/46, 44, 86, 15

[56] References Cited

U.S. PATENT DOCUMENTS 4,159,915 7/1979 Anantha .................. 357/46
4,260,906 4/1981 Tokumaru .................. 357/46

FOREIGN PATENT DOCUMENTS 7700739 8/1978 France .

OTHER PUBLICATIONS

Patent Abstracts of Japan, vol. 9, No. 204 (E-337)[1957], 21st Aug. 1985; & JP-A-60 70 756 (Nippon Denki).

Primary Examiner—Eugene R. LaRoche
Assistant Examiner—R. A. Ratliff
Attorney, Agent, or Firm—Wenderoth, Lind & Ponack

[57] ABSTRACT

The emitter region of a speed-up transistor is created in a base of a final transistor of a Darlington device and has a relatively low dopant concentration and small thickness.

2 Claims, 1 Drawing Sheet

DARLINGTON DEVICE WITH AN ULTRA-LIGHTWEIGHT EMITTER SPEED-UP TRANSISTOR

FIELD OF THE INVENTION

The present invention relates to a Darlington device with an ultra-lightweight emitter speed-up transistor.

BACKGROUND OF THE INVENTION

Bipolar power transistors in the Darlington configuration have the drawback of being very slow to switch on and off. In fact, at the moment of switching, the speed-up current of the charges stored in the base region has an immediate effect only on the driver transistor (T1) and a slower effect on the final transistor (T2).

The most commonly used means for speeding up the switching of a Darlington is to insert a speed-up diode between the base of the driver and that of the final transistor, as shown in the diagram of FIG. 1. This diode can be made integral with a very low gain speed-up transistor (T3), as shown in the diagram of FIG. 2.

In a known Darlington device, the base of the speed-up transistor T3 is highly-doped P++ in order to considerably lower the relative gain.

The known device entails the following drawbacks:

the step of diffusing the base of T3 is separate from the step of obtaining the bases of T1 and T2;

there is an unevenness in the gain of T3, due to the fact that it is not easy to control the base doping since it is deposited from a solid source;

there is an introduction of heavy metals due to the use of a solid doping source, with a consequent reduction of the lifetime and current characteristics of the device;

there is a greater probability of damage to the surface of the silicon due to the deposition of very large doses of dopant (boron).

SUMMARY OF THE INVENTION

The solution according to this invention aims at overcoming the aforesaid drawbacks. In particular, it offers the following advantages:

it enables the bases of T1, T2 and T3 to be made in a single step;

it ensures greater gain uniformity of T3, due to the possibility of using ion implantation for the formation of its base and of its emitter;

it increases the lifetime due to the absence of metallic ions, as a result of the aforesaid possibility of using ion implantation.

The device in accordance with the present invention is basically characterized by the fact that the emitter region of the speed-up transistor is formed in the base of the final transistor and has a relatively low dopant concentration and thickness.

Other inventive solutions are shown further on in the claims.

BRIEF DESCRIPTION OF THE DRAWINGS

The features of the invention will be more clearly evident from the following description with reference to the accompanying drawings of a non-restrictive embodiment, in which.

DESCRIPTION OF THE PREFERRED EMBODIMENT

Figure 1:
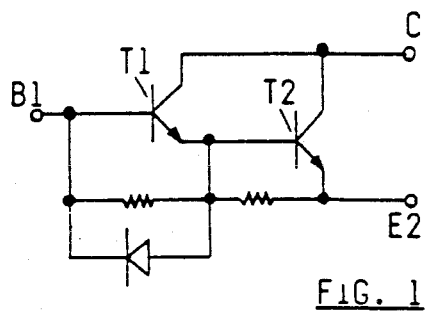
FIGS. 1 and 2 show the structure of a known Darlington Device.
Figure 2:
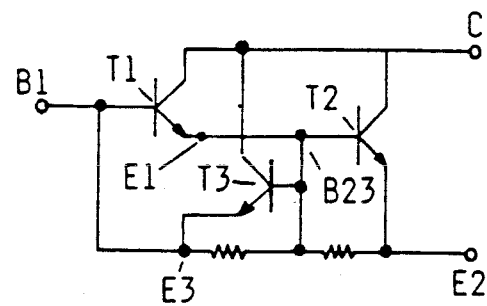
Figure 3:
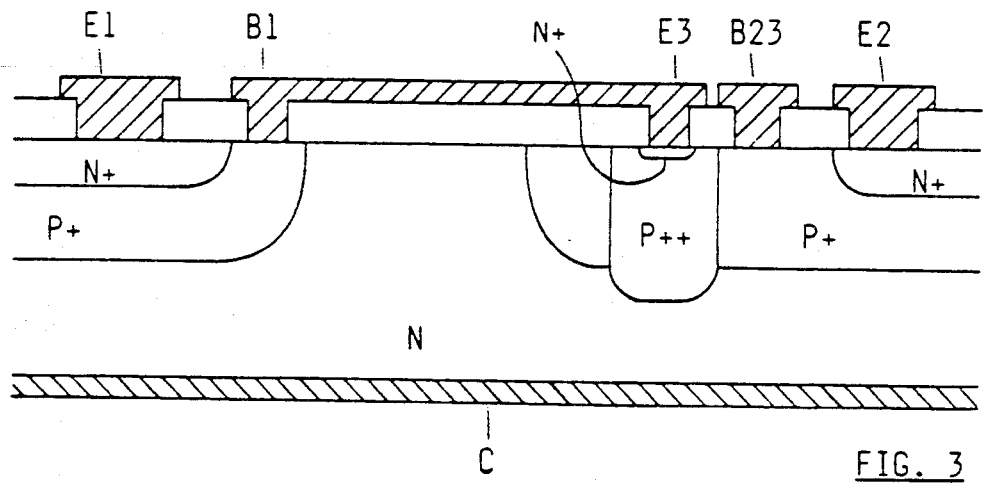
FIG. 3 shows a structure of a speed-up transistor made according to the known technique.

The method for manufacturing the known Darlington device of FIG. 3 comprises the following steps:

diffusion on an N substrate of the P+ bases of the transistors T1 and T2, using solid sources or implanting boron with a dose of approximately $10^{15}$ atoms/cm$^2$, so as to obtain a deeper base for transistor T3 than that of T1 and T2;

forming N+ emitter regions simultaneously for T1, T2 and T3.

The difference in doping between the P+ regions and the P++ region consists in a difference in depth between the emitters of T1 and T2 (<5 $\mu$m) and of T3 (<2 $\mu$m).

In this way a T3 transistor is obtained with a gain ranging from 0.01 to 0.02.

Figure 4:
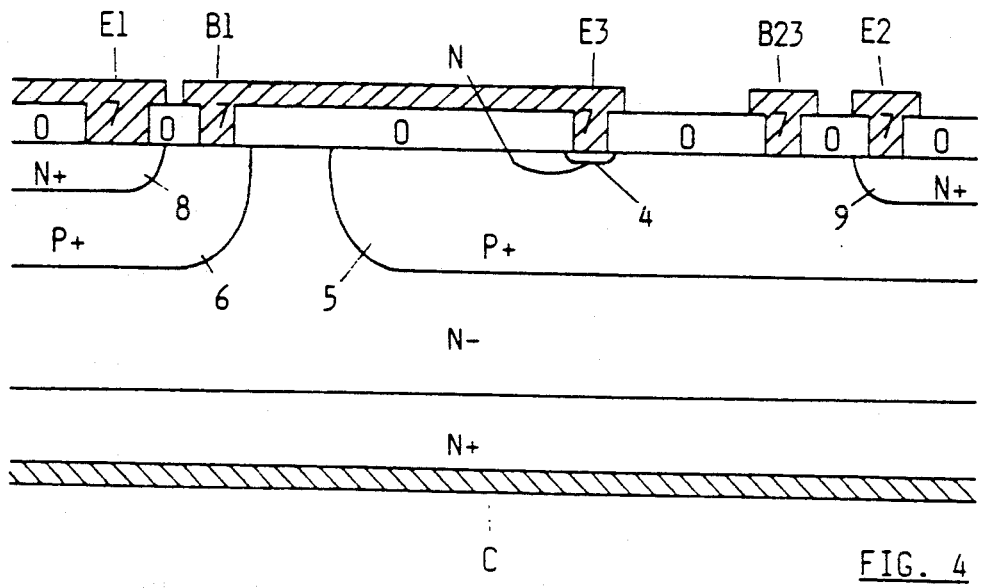
FIG. 4 shows the structure of a speed-up transistor made according to the present invention.

The structure of FIG. 4 refers to an NPN Darlington according to the present invention, constructed by means of the planar technique, in which the emitter region 4 of the speed-up transistor T3 is produced in a region 5 which acts as a common base with the transistor T2, and has a relatively low dopant concentration and small thickness. In particular, the base region 6 of T1 and the region 5 have a surface concentration of dopant of approximately $10^{15}$ atoms/cm$^3$ and a depth of approximately 10 $\mu$m, while the emitter region 4 of T3 ha a concentration of dopant slightly higher than that of the bases and a depth smaller by 1 $\mu$m.

The metallization on the front is made with a Pt/Ti/W/Al alloy in order to prevent spikes of Al from short-circuiting the emitter and the base of T3.

The gain of the transistor T3 made in this way is very low (ranging from 0.0002 to 0.001) due to the low concentration of dopant of the emitter and, consequently, to its very low efficiency.

The structure of FIG. 4 can be obtained by means of a process which comprises the following consecutive steps:

epitaxial growth of an N− type layer on an N+ type substrate; formation, in the N− layer, of the P+ bases of T1, T2 and T3, with an implantation of boron at a concentration of 7.8·$10^{14}$ atoms/cm$^2$ and subsequent diffusion for 8 hours at 1200° C., which make it possible to obtain bases with a surface concentration of dopant of approximately $10^{18}$ atoms/cm$^3$ and a depth of approximately 10 $\mu$m;

formation of the emitter regions 8, 9 and 4 of T1, T2 and T3, the emitter of the transistor T3 being made with an implantation of As at a dosage of 4.5·$10^{13}$ atoms/cm$^2$ and subsequent diffusion for 20' at 1100° C., which makes it possible to obtain an emitter region with a concentration slightly higher than the aforesaid concentration of the bases and with a depth smaller by 1 $\mu$m;

oxidation of the front (portions indicated by 0 in the figure) and opening of windows in the oxide for the contacts;

metallization of the front by means of a Pt/Ti/W/Al alloy.

It can be seen from the foregoing description that the method according to the present invention consists of creating the emitter of T3 in the same base as T2, thereby using a single process for forming the bases and eliminating the steps for forming a base with a higher concentration for T3.

The solution has been illustrated with reference to a single-stage NPN Darlington, constructed by means of the "planar" technique. It can, however, be applied, with obvious variations, to multi-stage Darlingtons and to those obtained by means of "epibase" and "multi-epimesa" techniques.

It can also be applied to a PNP Darlington, in which case, the steps for constructing the Darlington can be summarized as follows:

epitaxial growth of a P− type layer on a P type substrate;

forming the bases of the transistors T1, T2 and T3 by implantation of an N type dopant (e.g. phosphorus) at a concentration of $5 \cdot 10^{14}$ atoms/cm$^2$ and subsequent diffusion for 6 hours at 1200° C.;

forming the emitters of T1, T2 an T3 with P type dopant (e.g. boron); the ultra-lightweight and thin emitter of T3 is achieved by ion implantation of boron at a dosage of approximately $4-5 \cdot 10^{13}$ atoms/cm2 followed by diffusion of the boron for 20 minutes at a temperature of 100° C.

We claim:

1. A Darlington device comprising: a driver transistor; a final transistor; and a transistor acting as a speed-up diode; wherein an emitter region of said transistor acting as a speed-up diode is located in a base region of the final transistor and has a relatively low dopant concentration; and wherein the base regions of said transistors have a surface concentration of dopant of approximately $10^{15}$ atoms/cm$^3$ and a depth of approximately 10 μm and wherein an emitter region of said transistor acting as a speed-up diode has a concentration of dopant slightly higher than that of the bases and a depth which is smaller by 1 μm.

2. A Darlington device as claimed in claim 1, by the further comprising a metallization on a front surface thereof which consists of a Pt/Ti/W/Al alloy.

* * * * *